(12) United States Patent
Odaka et al.

(10) Patent No.: US 9,601,715 B2
(45) Date of Patent: Mar. 21, 2017

(54) METHOD OF MANUFACTURING DISPLAY DEVICE, METHOD OF EXPOSING TERMINAL OF DISPLAY DEVICE AND DISPLAY DEVICE

(71) Applicant: JAPAN DISPLAY INC., Tokyo (JP)

(72) Inventors: Kazuhiro Odaka, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/930,771

(22) Filed: Nov. 3, 2015

(65) Prior Publication Data

US 2016/0141549 A1    May 19, 2016

(30) Foreign Application Priority Data

Nov. 14, 2014   (JP) ................................. 2014-231278

(51) Int. Cl.
*H01L 51/56* (2006.01)
*H01L 51/52* (2006.01)
(Continued)

(52) U.S. Cl.
CPC ........ *H01L 51/5246* (2013.01); *H01L 27/124* (2013.01); *H01L 27/3276* (2013.01); *H01L 51/0024* (2013.01); *H01L 51/524* (2013.01); *H01L 51/5253* (2013.01); *H01L 51/56* (2013.01); *H01L 2251/566* (2013.01)

(58) Field of Classification Search
CPC ... H01L 51/5426; H01L 51/56; H01L 51/524; H01L 51/0024; H01L 27/124–27/1244; H01L 27/3251; H01L 27/3253; H01L 27/3276; H01L 2251/566; H01L 2227/323; H01L 51/5246; H01L 51/5253
See application file for complete search history.

(56) References Cited

U.S. PATENT DOCUMENTS 9,142,805 B2 * 9/2015 Yu ........................... H01L 51/56
2003/0184704 A1 * 10/2003 Akiyama .......... G02F 1/133305
349/158

(Continued)

FOREIGN PATENT DOCUMENTS

JP    2009-64590 A    3/2009

*Primary Examiner* — Marvin Payen
*Assistant Examiner* — Jeremy Joy
(74) *Attorney, Agent, or Firm* — Typha IP LLC

(57) ABSTRACT

A method of manufacturing a display device includes bonding together a first substrate and a second substrate sandwiching a first bonding material and a second bonding material, a substrate being formed by bonding the first and the second substrate and including a plurality of the display devices, the first bonding material being arranged in at least a display region, the second bonding material being a part of a terminal region and being arranged so as to cover the terminal, and the second bonding material having a stronger adhesion per unit area with respect to the second substrate than the first bonding material; cutting the second substrate at a cutting position between the terminal region and the display region for each of the display devices; removing the second substrate of the terminal region from the display device; and separating each of the display devices from the plurality of display devices.

12 Claims, 11 Drawing Sheets

(51) Int. Cl.
*H01L 27/32* (2006.01)
*H01L 51/00* (2006.01)
*H01L 27/12* (2006.01)

(56) References Cited

U.S. PATENT DOCUMENTS

| | | | | |
|---|---|---|---|---|
| 2005/0090075 A1* | 4/2005 | Takayama | H01L 27/1214 | 438/455 |
| 2008/0160864 A1* | 7/2008 | Song | H01L 51/525 | 445/3 |
| 2008/0309650 A1* | 12/2008 | Nishikawa | H01L 27/3276 | 345/206 |
| 2009/0011678 A1* | 1/2009 | Morikawa | H01L 27/3223 | 445/25 |
| 2009/0066214 A1* | 3/2009 | Choi | H01L 51/524 | 313/483 |
| 2014/0306288 A1* | 10/2014 | Adachi | H01L 27/1218 | 257/347 |
| 2014/0353637 A1* | 12/2014 | Kawata | H01L 27/3272 | 257/40 |
| 2014/0367661 A1* | 12/2014 | Akagawa | H01L 51/5256 | 257/40 |
| 2015/0287959 A1* | 10/2015 | Hanamura | H01L 51/5246 | 257/40 |

\* cited by examiner

METHOD OF MANUFACTURING DISPLAY DEVICE, METHOD OF EXPOSING TERMINAL OF DISPLAY DEVICE AND DISPLAY DEVICE

CROSS REFERENCE TO RELATED APPLICATIONS

This application is based upon and claims the benefit of priority from the prior Japanese Patent Application No. 2014-231278, filed on Nov. 14, 2014, the entire contents of which are incorporated herein by reference.

FIELD

The present invention is related to a manufacturing method of a display device.

BACKGROUND

A display device which uses a self-light emitting element such as an OLED (Organic Light Emitting Diode) is generally manufactured by bonding together a substrate formed with an OLED and a transistor for driving the OLED and an opposing substrate for sealing each element above the substrate. At this time, a sealing layer is formed for covering the OLED for suppressing deterioration of the elements. The sealing layer is formed by an insulation material.

FPC (Flexible printed circuits), driver IC and terminals for connecting other substrates are arranged in a display device. When a sealing layer which is an insulation material is formed covering these terminals, it is necessary to expose the conductive surface of the terminals by removing the sealing layer above the terminals. As a result, a sealing layer is not formed above a terminal and it is necessary to remove the sealing layer in the case where the sealing layer is formed above a terminal.

According to the technology described in Japanese Laid Open Patent Publication No 2009-64590, a separation layer is formed in advance above a terminal and a sealing layer is formed above the separation layer. In this way, when removing the terminal part of the opposing substrate, the sealing layer and separation layer formed above the terminal are removed along with the opposing substrate and the terminal is exposed.

SUMMARY

One embodiment provides a method of manufacturing a display device including bonding together a first substrate and a second substrate sandwiching a first bonding material and a second bonding material, a substrate being formed by bonding the first substrate and the second substrate and including a plurality of the display devices; the first substrate being arranged with a display region and a terminal region corresponding to each of the display devices, the display region including a light emitting element including an organic layer, a sealing layer covering the light emitting element, and a drive element for making the light emitting element emit light, the terminal region being arranged with a terminal for supplying a signal to the drive element, the organic layer and the sealing layer being arranged above the terminal of the terminal region, the first bonding material being arranged in at least the display region, the second bonding material being a part of the terminal region and being arranged so as to cover the terminal, and the second bonding material having a stronger adhesion per unit area with respect to the second substrate than the first bonding material; cutting the second substrate at a cutting position between the terminal region and the display region for each of the display devices; removing the second substrate of the terminal region from the display device, at least one part of the terminal being exposed by removing the organic layer arranged above the terminal and the sealing layer together with the second substrate via the second bonding material adhered to the second substrate; and separating each of the display devices from the plurality of display devices.

In addition, one embodiment provides a method of manufacturing exposing a terminal of a display device including bonding together a first substrate and a second substrate sandwiching a first bonding material and a second bonding material, a substrate being formed by bonding the first substrate and the second substrate and including a plurality of the display devices, the first substrate being arranged with a display region and a terminal region corresponding to each of the display devices, the display region including a light emitting element including an organic layer, a sealing layer covering the light emitting element, and a drive element for making the light emitting element emit light, the terminal region being arranged with a terminal for supplying a signal to the drive element, the organic layer and the sealing layer being arranged above the terminal of the terminal region, the first bonding material being arranged in at least the display region, the second bonding material being a part of the terminal region and being arranged so as to cover the terminal, and the second bonding material having a stronger adhesion per unit area with respect to the second substrate than the first bonding material; cutting the second substrate at a cutting position between the terminal region and the display region for each of the display devices; and separating each of the display devices from the plurality of display devices, the second substrate of the terminal region being removed from the display device, and at least one part of the terminal being exposed by removing the organic layer arranged above the terminal and the sealing layer together with the second substrate via the second bonding material adhered to the second substrate.

In addition, one embodiment provides a display device including a first substrate arranged with a display region and a terminal region, the display region including a light emitting element including an organic layer, a sealing layer covering the light emitting element, and a drive element for making the light emitting element emit light, the terminal region being arranged with a terminal for supplying a signal to the drive element, and the terminal being exposed; and a second substrate bonded to the display region of the first substrate sandwiching a first bonding material, the first bonding material between the second substrate and the first substrate protruding further than an end part of the terminal region side of the second substrate.

DESCRIPTION OF EMBODIMENTS

Each embodiment of the present invention is explained below while referring to the diagrams. Furthermore, the disclosure is merely an example and appropriate modifications could be conceived while maintaining the scope of the invention which are also included in the scope of the present invention. In addition, in order to better clarify the invention, the width and shape etc. of each part in drawings are sometimes shown schematically compared to the actual forms and should not be interpreted as limiting the present invention. In addition, in the specification and each drawing, the same reference symbols are attached to similar elements which have previously been described and a detailed explanation of these elements may be omitted where appropriate.

First Embodiment

Approximate Structure

A display device in the first embodiment of the present invention is an organic EL (Electro-Luminescence) display device using an OLED as a light emitting element. The organic EL display device in the present example uses an OLED which emits white light. The white light from this OLED is passed through a color filter to obtain a color display. Furthermore, the organic EL display device may also obtain a color display using OLED's emitting red, green and blue light respectively without using a color filter.

The display device has a structure in which a first substrate and second substrate are bonded together by a bonding material. Drive elements such as a thin film transistor (TFT) for controlling the light emitting state of an OLED, and a terminal for supplying a signal to the drive elements are arranged in the first substrate. A color filter etc. is formed in the second substrate.

A top emission type method is used in which light from the OLED arranged in the first substrate is output to the opposite side to the first substrate side, passes through the color filter arranged in the second substrate and is observed by a user.

While it is possible to easily remove a sealing layer above a terminal using a manufacturing process in which an opposing substrate is removed as in the technology disclosed in Japanese Laid Open Patent Publication No 2009-64590, parts where a conducive surface of a terminal can not be exposed without removing a sealing layer may be produced leading to a decrease in yield. Therefore, it is preferred that yield is improved by more securely removing the sealing layer above a terminal.

One aim of the present invention is to improved yield when removing a sealing layer formed above a terminal.

In the display device in the first embodiment of the present invention, as is described below, it is possible to easily remove an insulation material formed above a terminal when removing a second substrate above the terminal and improve yield.

[External Structure of a Display Device 1]

Figure 1:
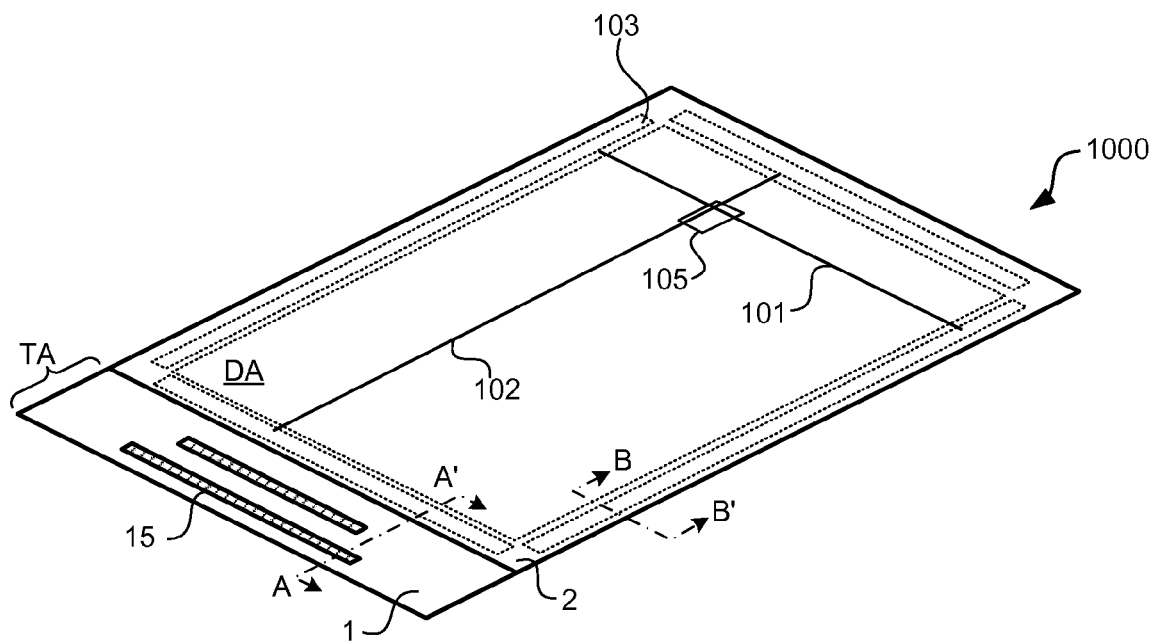
FIG. 1 is a planar view diagram showing an approximate structure of a display device in a first embodiment of the present invention.

FIG. 1 is a planar view diagram showing an approximate structure of a display device 1000 in the first embodiment of the present invention. The display device 1000 is arranged with a first substrate 1 arranged with a terminal region TA, a display region DA and a scanning line drive circuit 103, and a second substrate 2 arranged so as to cover the display region DA and scanning line drive circuit 103. A color filter and the like may be arranged in the second substrate 2.

A scanning line 101 and a data signal line 102 intersecting the scanning line 101 in a perpendicular direction are arranged in the display region DA. A pixel 105 is arranged at a position corresponding to an intersection part between the scanning line 101 and data signal line 102. The pixel 105 is arranged in a matrix shape. Furthermore, in FIG. 1, although there is only one signal line extending in a direction along the scanning line 101 or data signal line 102 for every single pixel 105, a plurality of signal lines may also be arranged. In addition, wiring which supplies a certain voltage such as a power supply line and the like may be arranged in the display region DA.

The terminal region TA is arranged with a terminal 15 for connecting a driver IC, and other substrates such as a FPC in the first substrate 1. The second substrate is not present in the terminal region TA in order to connect these substrates and a conductive surface of the terminal 15 is exposed.

The scanning line drive circuit 103 supplies a scanning signal to the scanning line 101. For example, when a driver IC is connected to the terminal 15, the data signal line 102 is supplied with a data voltage by the driver IC and the scanning line drive circuit 103 is controlled. Furthermore, other driver circuits may also be arranged in the periphery of the display region DA.

A display element including a pixel circuit for controlling emitted light based on a scanning signal and data voltage, and a light emitting element (OLED) in which emitted light is controlled by the pixel circuit are arranged in each pixel 105. The pixel circuit includes for example a thin film transistor and capacitor, the thin film transistor is driven by a scanning signal and data voltage and controls light emitted by the light emitting element. An image is displayed in the display region DA by control of this emitted light.

[Cross-Sectional Structure of the Display Device 1000]

Next, a cross-sectional structure of the display device 1000 is explained. In order to better clarify the characteristic parts of the present embodiment, a cross-sectional structure in the vicinity of a substrate end part is explained. The invention is explained in detail below using a schematic view of a cross-sectional structure along the cross-sectional lines A-A' and B-B' in FIG. 1.

Figure 2:
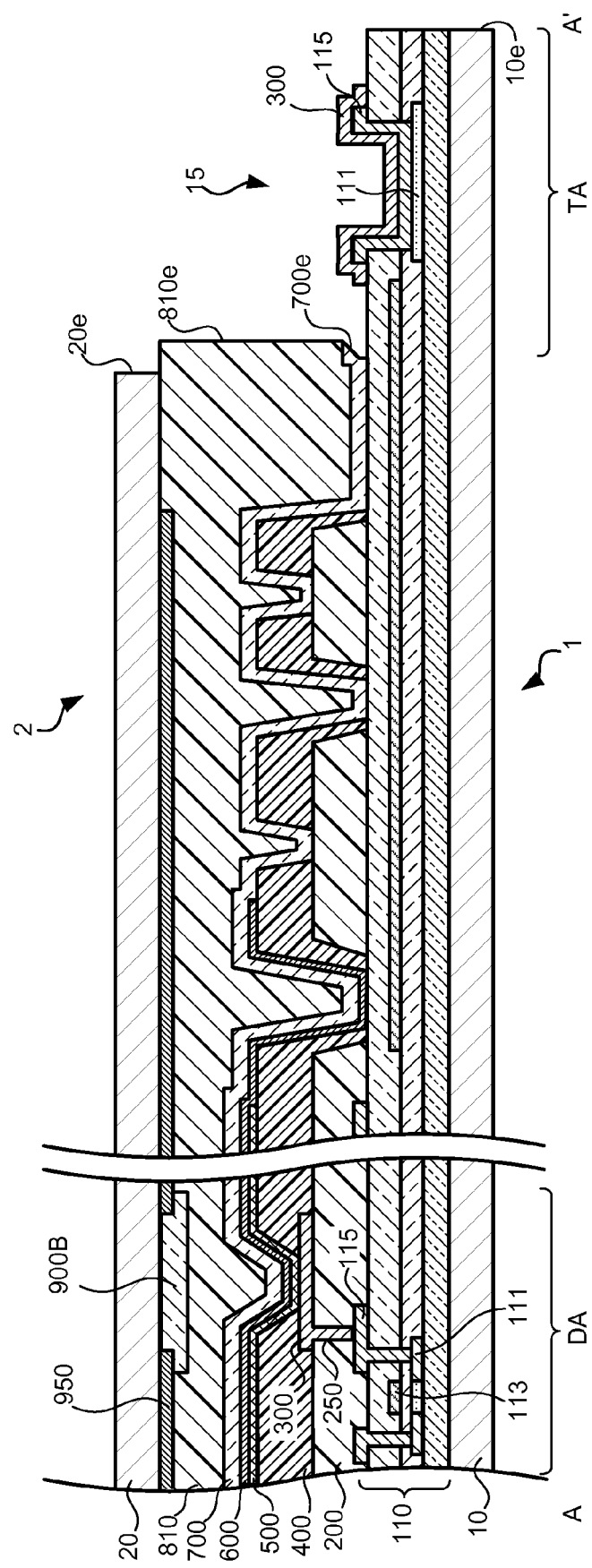
FIG. 2 is a schematic diagram showing a cross-sectional structure (cross sectional structure along the cross section line A-A' in FIG. 1) of the display device in the first embodiment of the present invention.
Figure 3:
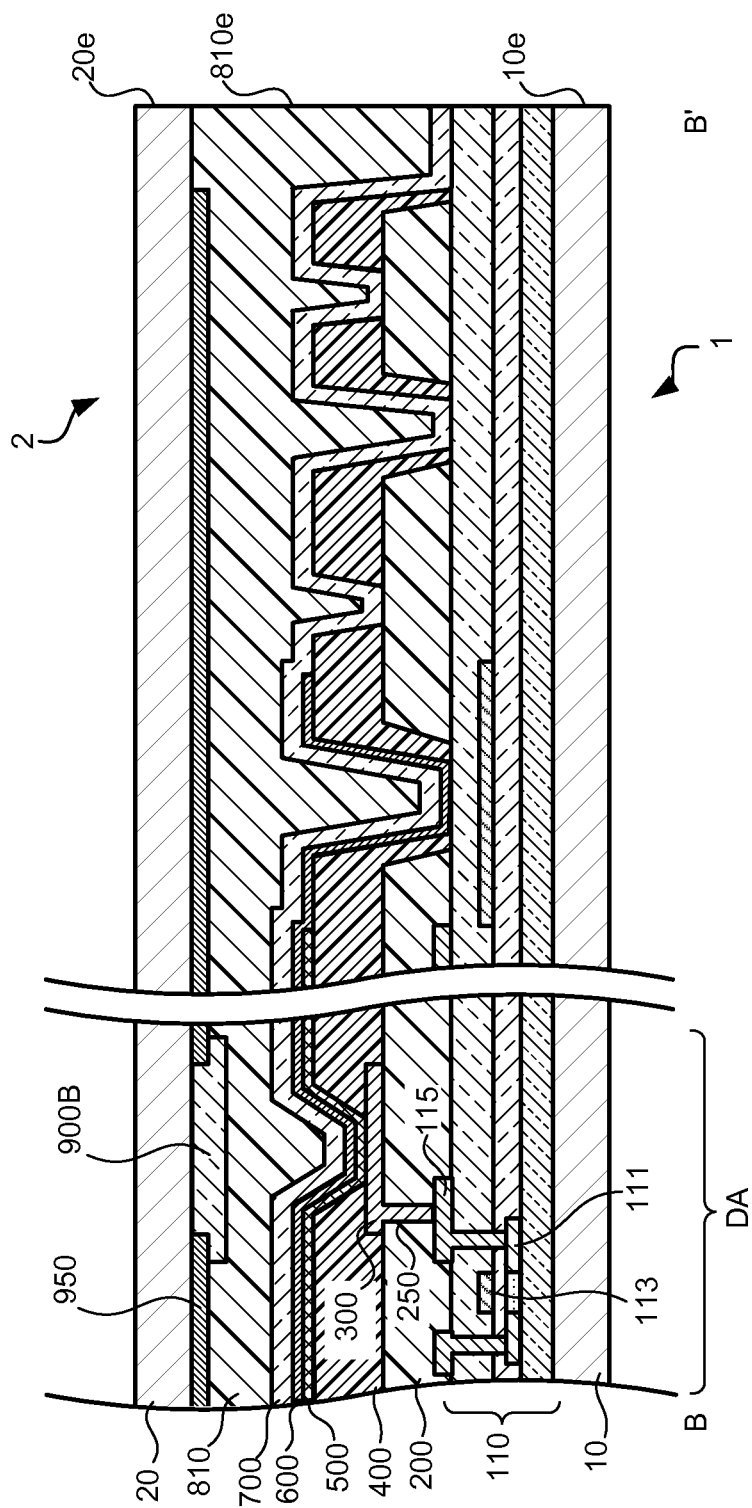
FIG. 3 is a schematic diagram showing a cross-sectional structure (cross sectional structure along the cross section line B-B' in FIG. 1) of the display device in the first embodiment of the present invention.

FIG. 2 is a schematic diagram showing a cross-sectional structure (cross sectional structure along the cross section line A-A' in FIG. 1) of the display device in the first embodiment of the present invention. FIG. 3 is a schematic diagram showing a cross-sectional structure (cross sectional structure along the cross section line B-B' in FIG. 1) of the display device in the first embodiment of the present invention. FIG. 2 and FIG. 3 show an end surface view corresponding to each cross-sectional line. The schematic diagrams showing cross-sectional structures below also correspond to an end surface view respectively.

A first support substrate 10 in the first substrate 1 and a second support substrate 20 in the second substrate 2 are glass substrates. Furthermore, either one or both of the first support substrate 10 and second support substrate 20 may also be an organic resin substrate having flexibility.

The structure of the first substrate 1 is explained. A thin film transistor 110 is arranged above the first support substrate 10. The thin film transistor 110 includes a semiconductor layer 111, a gate electrode 113 and a conducive layer 115 connected to the source or drain of the semiconductor layer 111. The gate electrode 113 and conductive layer 115 may also be used as wiring.

An interlayer insulation layer 200 is arranged so as to cover the thin film transistor 110. A pixel electrode 300 is arranged above the interlayer insulation layer 200. The interlayer insulation layer 200 for example is coated with a photosensitive acrylic resin and is formed into a certain pattern via exposure, development and sintering. Furthermore, although the interlayer insulation layer 200 is shown as being formed by a single layer in FIG. 2 and FIG. 3, the interlayer insulation layer 200 may also be formed from a plurality of stacked insulation films. In this case, wiring may also be arranged between the plurality of insulation films.

The pixel electrode 300 is connected to the thin film transistor 110 via a contact hole 250 arranged in the interlayer insulation layer 200. Since the display device 1 displays an image using a top emission type method, the pixel electrode 300 does not have to include transparency. Therefore, the pixel electrode 300 may include a layer which reflects light output by an OLED. In this example, the pixel electrode 300 includes a metal oxide such as ITO (Indium Tin Oxide), IZO (Indium Zinc Oxide) and an electrode (Al, Ag) which reflects light on a lower layer and becomes an anode electrode of an OLED.

In this example, the pixel electrode 300 is stacked with the semiconductor layer 11 and conductive layer 115 described above and the terminal 15 is formed in the terminal region TA.

A bank layer 400 covers an end part of the pixel electrode 300 and a space between adjacent pixels and is arranged with an aperture which exposes a part of the pixel electrode 300. The bank layer 400 is coated with a photosensitive acrylic resin and is formed into a certain pattern via exposure, development and sintering.

The OLED layer 500 covers the pixel electrode 300 and the bank layer 400. The OLED is an element stacked with organic layers, for example, a hole injection layer, a hole transport layer, a light emitting layer, an electron transport layer and an electron injection layer in this order from the pixel electrode side. The OLED layer 500, for example, is formed by vapor deposition in a certain region using a mask. In this example, the OLED layer 500 is formed in a light emitting region of the display region DA.

A translucent electrode 600 covers the OLED layer 500 and forms a cathode electrode of an OLED. The translucent electrode 600 is an electrode which allows light from an OLED to pass through and includes, for example, a metal oxide such as ITO, IZO or a thin metal layer sufficient to allow light to pass through. The translucent electrode 600 is formed in a certain region by sputtering etc. using a mask.

When a current is supplied to the OLED layer 500 via the pixel electrode 300 and translucent electrode 600, light which display an image is output via the translucent electrode 600. As a result, a region of the pixel electrode 300 exposed by the bank layer 400 serves as a light emitting region.

A sealing layer 700 is a layer for suppressing components which deteriorate a light emitting layer such as water or gas from contacting the OLED layer 500 and is an inorganic insulation layer such as silicon nitride covering the translucent electrode 600. The sealing layer 700 is removed in the terminal region TA side and an end part 700e of the sealing layer 700 exists in the terminal region TA side.

The terminal 15 is arranged in the terminal region TA. In this example, the terminal 15 includes a stacked structure of the semiconductor layer 111, the conductive layer 115 and pixel electrode 300. The pixel electrode 300 is exposed as a conductive surface of the terminal 15. Furthermore, the structure of the terminal 15 is not limited to the stacked structure shown in FIG. 2 and may also include more stacked layers or a single layer. That is, the terminal 15 may have a conductive surface which may be exposed. This completes the explanation of the first substrate 1.

Next, a structure of the second substrate 2 is explained. A light shielding layer 950 and color filters corresponding to red (R), green (G) and blue (B) are arranged in the second support substrate 20. The light shielding layer 950 is formed using a material with light shielding properties such as metal. In addition, the light shielding layer 950 in this example is formed in boundary part of different color pixels and in a region on the outer side of the display region DA.

Color filters 900R, 900G and 900B are arranged corresponding to a light emitting region of each pixel. The color filters 900R, 900G and 900B are coated with a photosensitive resin including a pigment for each color and formed into a certain pattern via exposure, development and sintering. The color filters may be formed using a printing method or an inkjet method. Furthermore, in FIG. 2 and FIG. 3, the color filter 900B is shown as an example arrangement corresponding to a light emitting region and the color filters 900R and 900G are omitted.

A first bonding material 810 is a material for bonding the first substrate 1 and second substrate 2 and is formed from acrylic resin for example. The first bonding material 810 is arranged in at least the display region DA. Therefore, the first bonding material 810 includes translucency. Since the first bonding material 810 is filled between the first substrate 1 and the second substrate 2, the expression filler material is sometime used.

The second support substrate 20 and the first bonding material 810 are not present in the terminal region TA in order to expose the conductive surface of the terminal 15 as is shown in FIG. 2. As a result, an part 20e of the second support substrate 20 and an end part 810e of the first bonding material 810 exists in the terminal region TA side. In addition, the end part 810e protrudes further to the terminal region TA side than the end part 20e. With this structure, it becomes difficult for the first bonding material 810 side of the end part 20e of the second support substrate 20 to break.

As a result, it is difficult for the second support substrate 20 to peel from the first bonding material 810, that is, peeling strength is improved.

As is shown in FIG. 3, with respect to the three edges apart from the edge of the terminal region TA side in the first substrate, the position of the end part 810e of the first bonding material 810, an end part 10e of the first substrate 10 and end part 20e of the second substrate 20 are almost uniform.

[Bonding Method of First Substrate and Second Substrate]

The first substrate (referred to below as first substrate 1Y) and the second substrate (referred to below as second substrate 2Y) are bonded together before being separated into a plurality of display devices 1000. Below, a structure of a state in which the first substrate 1Y and second substrate 2Y are bonded together is sometimes referred to as a bonded substrate as a whole. Following this, the bonded substrate is cut and separated into a plurality of display devices 1000.

Figure 4:
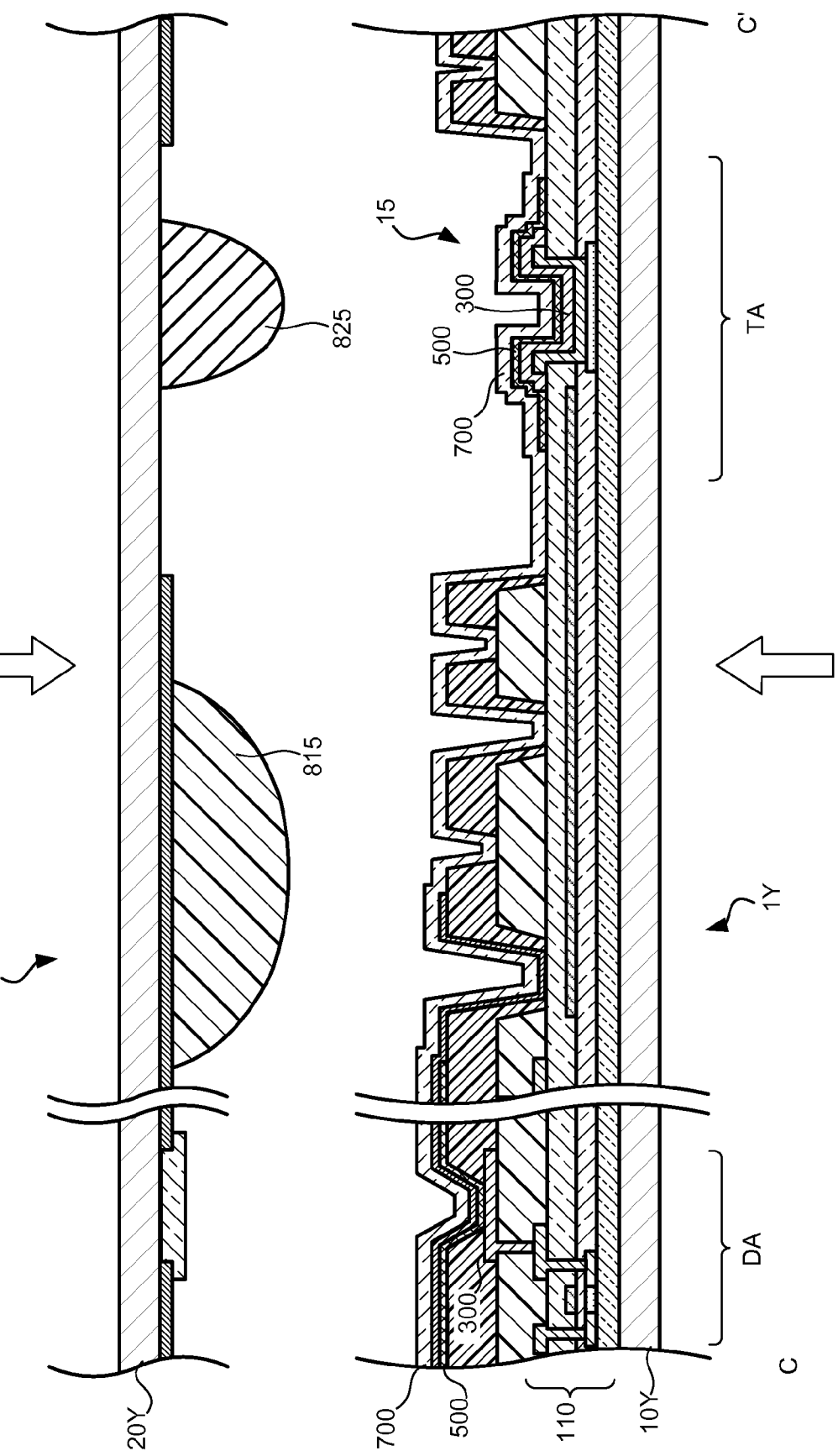
FIG. 4 is a diagram for explaining a method of bonding a first substrate and a second substrate in the first embodiment of the present invention.

FIG. 4 is a diagram for explaining a method for bonding the first substrate and second substrate in the first embodiment of the present invention. A first bonding material 815 before curing and second bonding material 825 before curing are discharged onto the second substrate 2Y formed with the light shielding layer 950 and color filters 900R, 900G, 900B. In this example, the second bonding material 825 has a higher viscosity than the first bonding material 815. Furthermore, a cured first bonding material 815 is described as the first bonding material 810 and a cured second bonding material 825 is described as the second bonding material 820.

The second bonding material 825 is discharged onto a part of the terminal region TA. In addition, the first bonding material 815 is dispersed and discharged onto areas other than the area where the second bonding material 825 is discharged. As is described below, each discharge position is controlled so that the second bonding material 825 covers the terminal 15 and the first bonding material 815 covers all other area (at least the display region DA) (refer to FIG. 5) in a state after the first substrate 1Y and second substrate 2Y are pushed together and bonded. Furthermore, since the second bonding material 825 has a higher viscosity than the first bonding material 815, controllability of the discharge position is increased. Therefore, it is easy to control so that the second bonding material 825 does not protrude to the outer side from the terminal region TA. On the other hand, since the first bonding material 815 has a lower viscosity, it is easy to spread over the entire display region DA.

Although the first bonding material 815 and second bonding material 825 are shown discharged onto the second substrate 2Y in FIG. 4, either or both may also be discharged onto the first substrate 1Y. Furthermore, a spacer for controlling a gap between the first substrate 1Y and second substrate 2Y may also be included in the second bonding material 825.

In this way, the second substrate 2Y on which the first bonding material 815 and second bonding material 825 are discharged is bonded to the first substrate 1Y formed with a light emitting element, drive element and terminal 15 and the like.

Before bonding the first substrate 1Y and second substrate 2TY, the OLED layer 500 is formed above the pixel electrode 300 which becomes a conductive surface of the terminal 15 of the first substrate 1Y and the sealing layer 700 is further arranged above the OLED layer 500. Furthermore, the OLED layer 500 does not have to be a stacked structure including all of the organic layers required for emitting light and may be a stacked layer structure or single layer structure including just a part of an organic layer. In addition, the OLED layer 500 formed above the terminal 15 may be formed in the periphery of the terminal 15 as well as above the terminal 15. This range may include just the inner side of the terminal region TA (between the cutting positions SL1 and SL2), the outer side of the terminal region TA or just above the terminal 15.

[Substrate Cutting Position]

Figure 5:
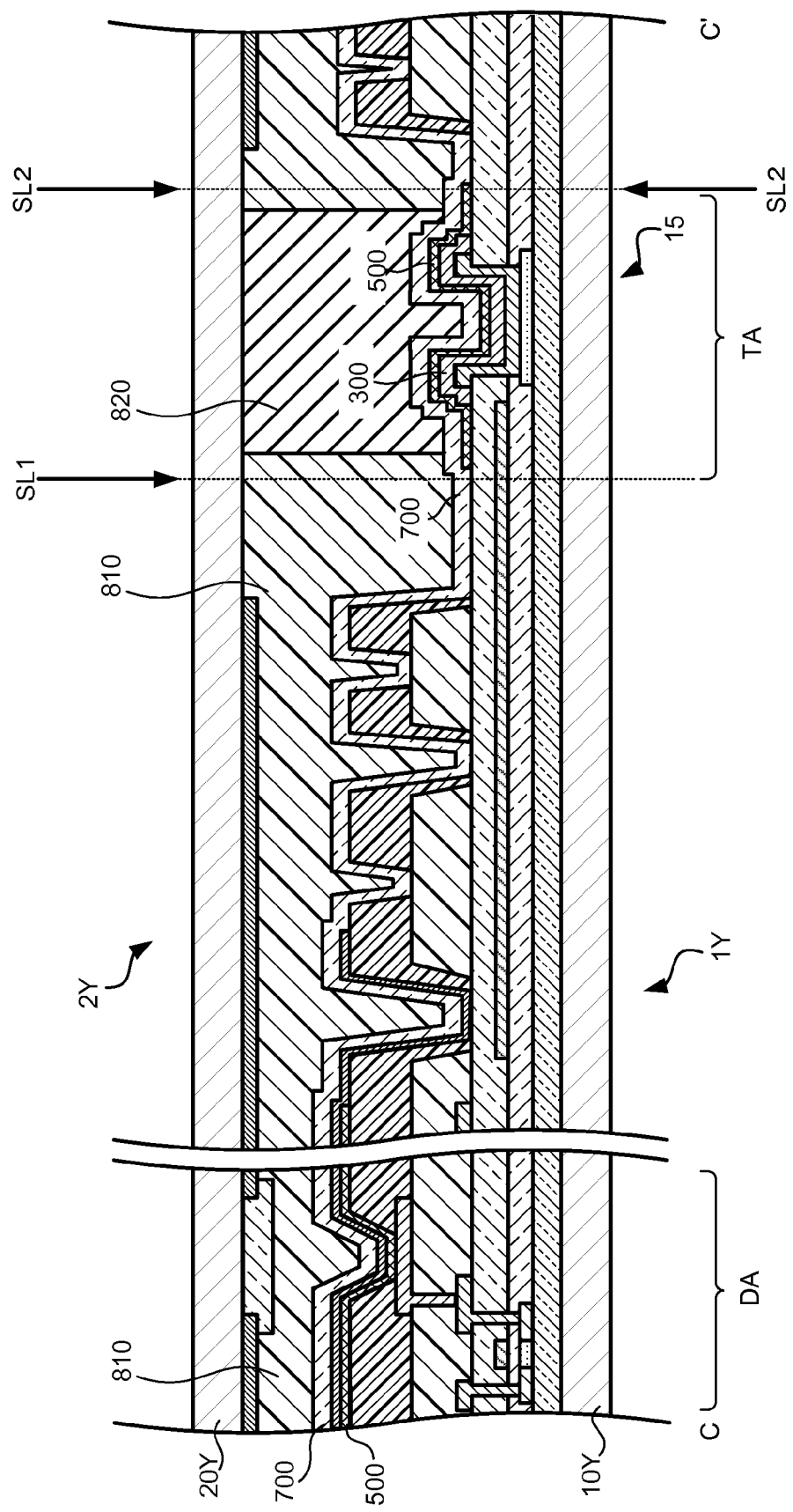
FIG. 5 is a schematic diagram showing a cross-sectional structure (cross sectional structure along the cross section line C-C' in FIG. 6) of a bonding substrate in the first embodiment of the present invention.
Figure 6:
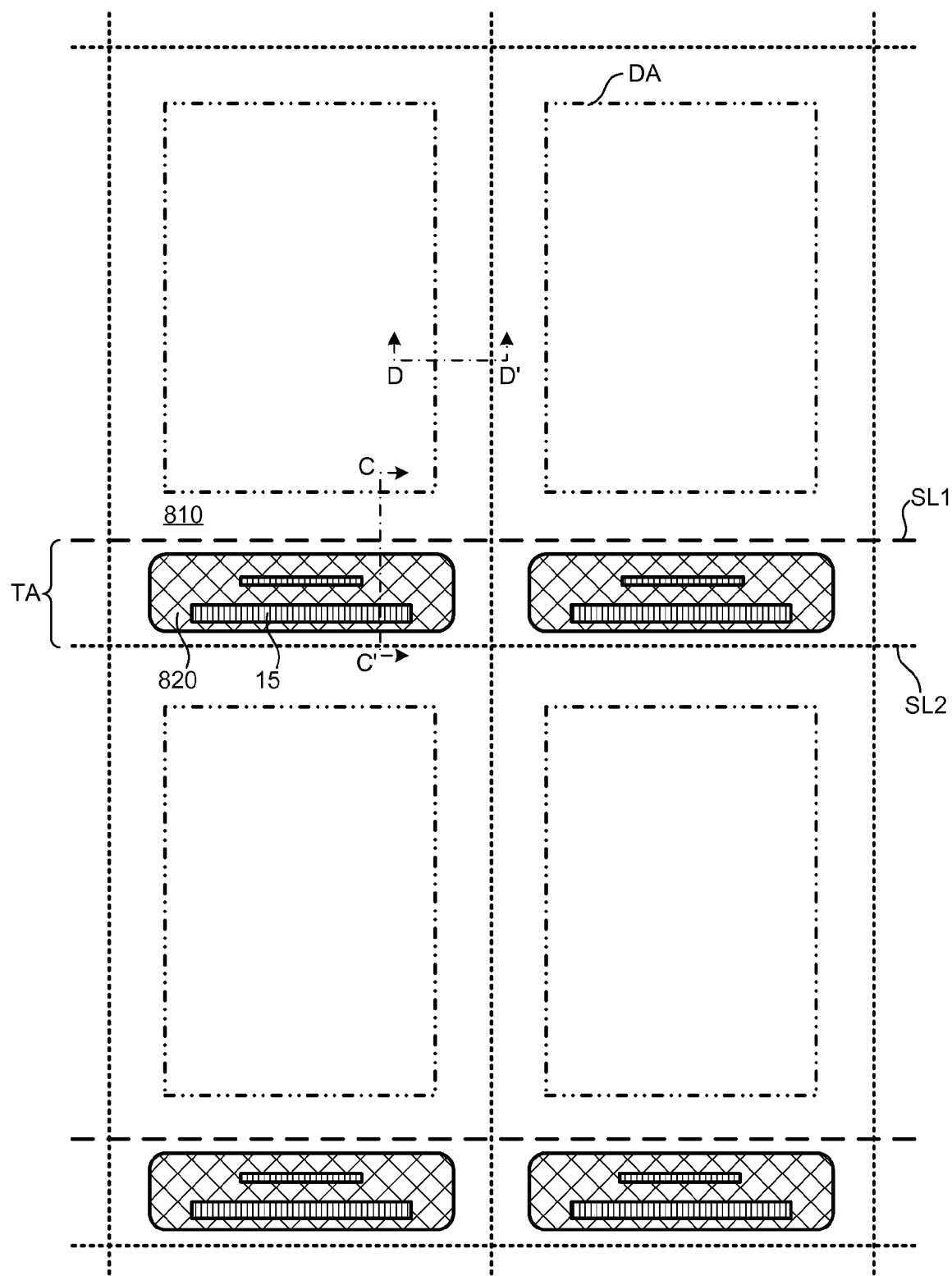
FIG. 6 is a planar view diagram showing a region arranged with a second bonding material in the first embodiment of the present invention.

FIG. 5 is a schematic diagram showing a cross-sectional structure (cross sectional structure along the cross section line C-C' in FIG. 6) of a bonding substrate in the first embodiment of the present invention. When the first substrate 1Y and the second substrate 2Y are bonded, the first bonding material 815 and the second bonding material 825 are pushed by both substrates and spread to the periphery.

In this way, the first substrate 1Y and second substrate 2Y are bonded by curing the first bonding material 815 and second bonding material 825 which spread to the periphery using ultraviolet radiation etc. As a result, as is shown in FIG. 5, the first substrate 1Y and second substrate 2Y are fixed by the cured first bonding material 810 and second bonding material 820. In this way, the cured second bonding material 820 has a stronger adhesion per unit area with respect to the second substrate 2Y than the first bonding material 810.

Following this, the second support substrate 20Y is cut at the cutting position SL1. The first support substrate 10Y and second support substrate 20Y are cut at the cutting position SL2.

FIG. 6 is a planar view diagram showing a region arranged with the second bonding material in the first embodiment of the present invention. As is shown in FIG. 6, the cutting position SL1 is set between the terminal region TA and display region DA. The cutting position SL2 is set corresponding to the exterior periphery of the display device 1000. Therefore, when the second substrate 2Y is cut following the cutting positions SL1 and SL2, a part corresponding to the terminal region TA (second separation substrate 20T shown in FIG. 8) is cut away from the display device 1000.

The second bonding material 820 is arranged so as to cover the terminal 15 in the terminal region TA. The first bonding material 810 spreads in areas other than the region where the second bonding material 820 exists. Furthermore, the first bonding material 810 is not limited to the case of existing in all areas other than the region where the second bonding material 820 exists, it may not exist in a part of this region but it is preferred that it is arranged to spread in at least all areas other than the terminal region TA.

In this example, the second bonding material 820 is arranged so as not exist between the first substrate 1Y and second substrate 2Y at the cutting positions SL1, SL2. That is, the first bonding material 810 exists between the first substrate 1Y and second substrate 2Y in the parts of the cutting positions SL1, SL2. A region in which the first bonding material 810 is not present may also exist in one part.

In addition, with regards to the cutting position SL2 between adjacent terminal regions TA (terminal regions TA adjacent in a left-right direction in FIG. 6), the second bonding material 820 is arranged no to exist between the first substrate 1Y and second substrate 2Y. Furthermore, the second bonding material 820 may also be arranged to exist at this position. In this case, the second bonding material 820 is arranged continuously across a plurality of adjacent terminal regions TA.

Figure 7:
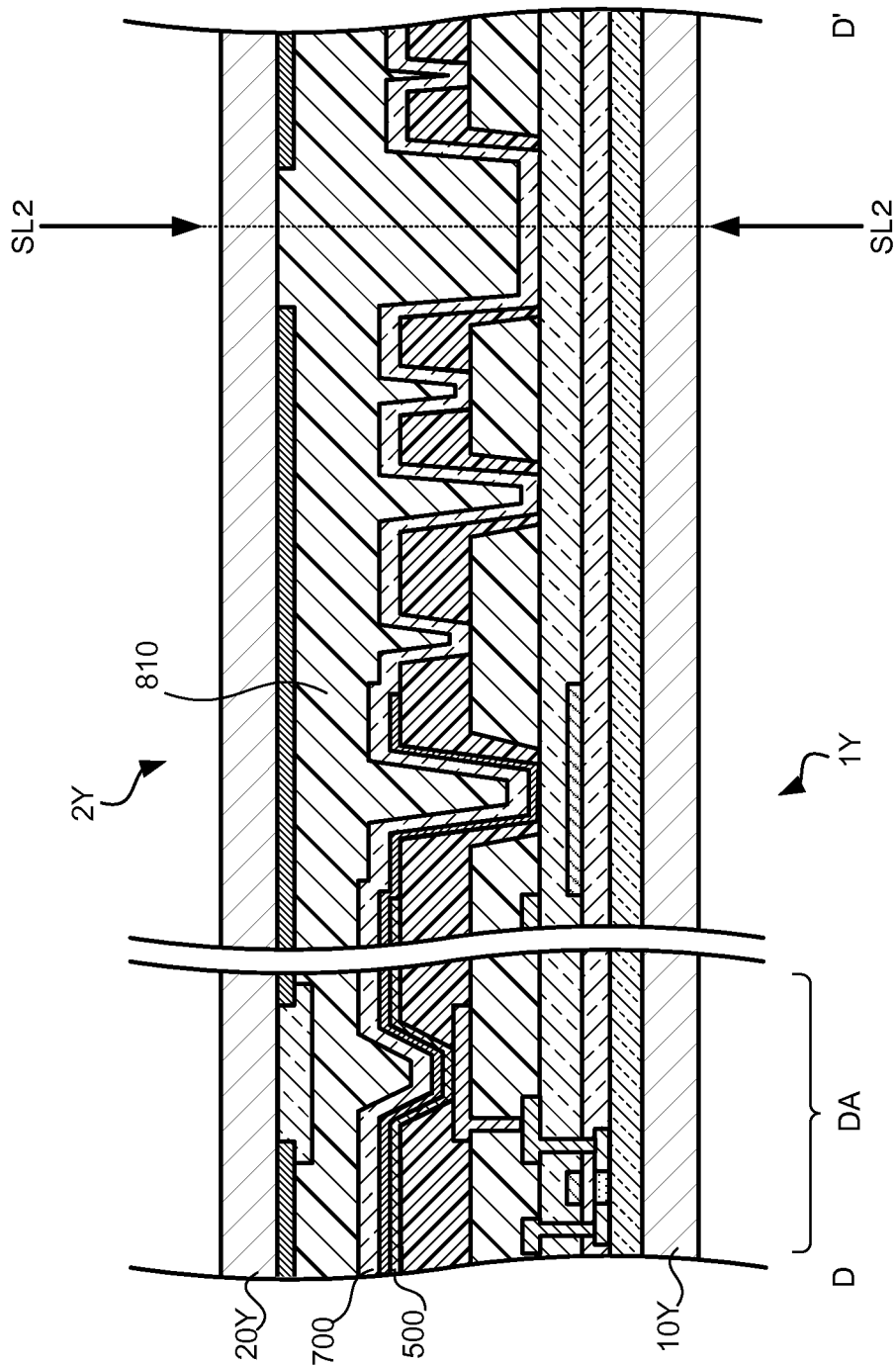
FIG. 7 is a schematic diagram showing a cross-sectional structure (cross sectional structure along the cross section line D-D' in FIG. 6) of the bonding substrate in the first embodiment of the present invention.

FIG. 7 is a schematic diagram showing a cross-sectional structure (cross sectional structure along the cross section line D-D' in FIG. 6) of the bonding substrate in the first embodiment of the present invention. As is shown in FIG. 6 and FIG. 7, the first bonding material 810 is arranged to spread between the first substrate 1Y and second substrate 2Y at the cutting position SL2 of the three edges apart from the edge on the terminal region TA side of each display device.

[Method for Separating the Display Device 1000]

Figure 8:
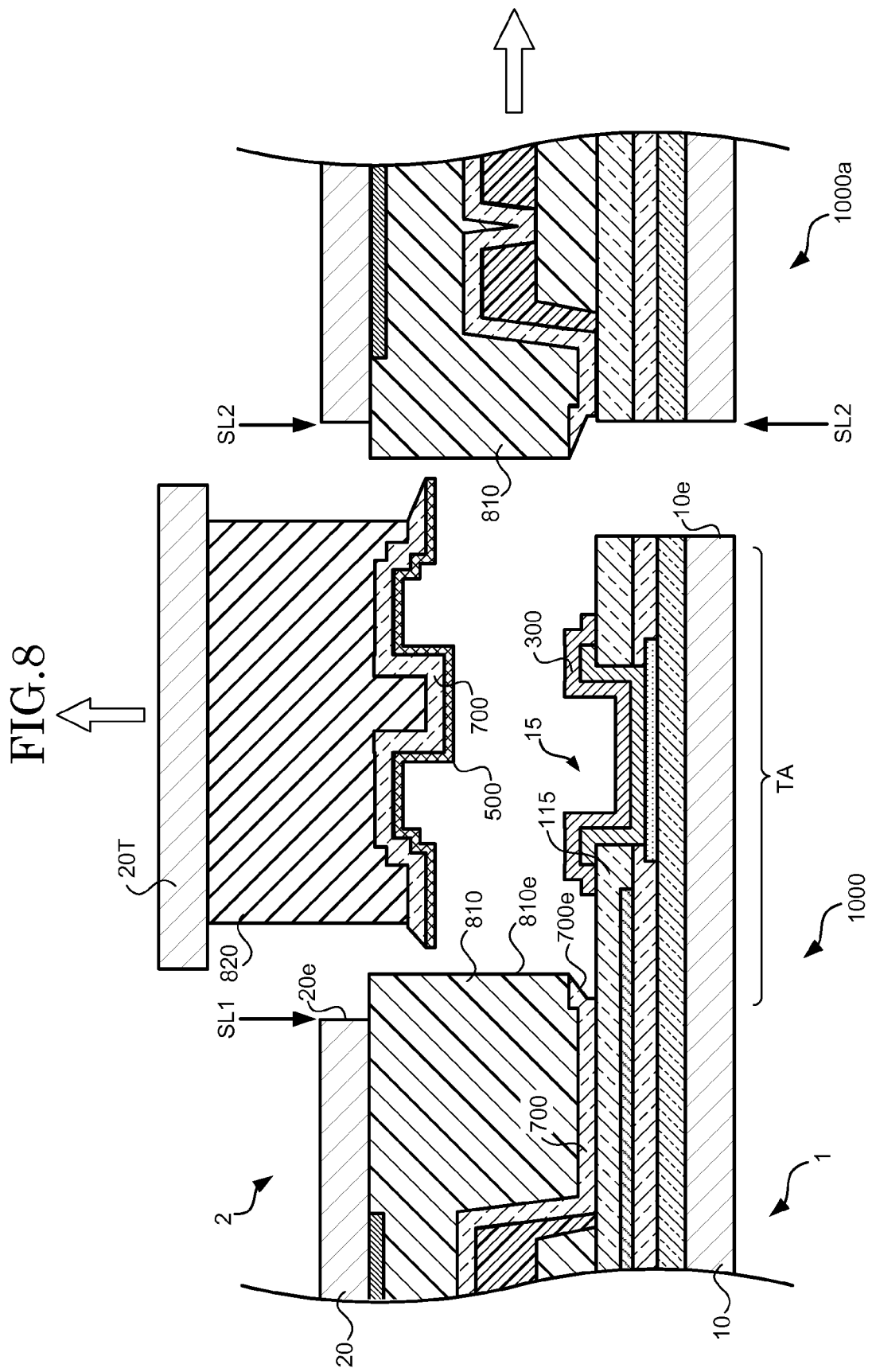
FIG. 8 is a diagram for explaining a method for separating a display device in the first embodiment of the present invention.

FIG. 8 is a diagram for explaining a method for separating a display device in the first embodiment of the present invention. After cutting the substrate at the cutting positions SL1, SI2 in FIG. 5, the bonding substrate arranged with a plurality of display devices 1000 is separated in each display device 1000. FIG. 8 shows an expanded view of the vicinity of the cutting positions SL1, SL2.

At the cutting position SL2, the display device 1000 is separated into adjacent display devices 1000a. The second support substrate (referred to below as second separation substrate 20T) separated corresponding to the terminal region TA is separated from the first substrate 1 as well as the sealing layer 700 adhered via the second bonding material 820. This phenomenon occurs because the adhesion with respect to layers other than the OLED layer 500 (organic layer) is low compared to the adhesives between each of the other layers.

In the example shown in FIG. 8, the OLED layer 500 peels from the conductive surface (pixel electrode 300) of the terminal 15 together with the sealing layer 700. Furthermore, a part of the OLED layer 500 may sometimes remain on the terminal 15 side. A part of the OLED layer 500 which remains on the terminal 15 side may remain on a part of the surface of the terminal 15 or a part of the stacked organic layers which form the OLED layer 500 may remain.

In this way, considering the case where a part of the OLED layer 500 remains on the terminal 15 side, cleaning is performed in order to remove the remaining OLED layer 500 and the conductive surface (pixel electrode 300) may be further exposed. The cleaning may be performed using water or performed in combination with an etching agent with a high etching rate with respect to the OLED 500 and a low etching rate with respect to the structural material of the terminal 15 and material arranged in the periphery.

In addition, the second bonding material 820 has a higher adhesion per unit area with respect to the second substrate 2 (2Y) than the first bonding material 810 as described above. As a result, the first bonding material 810 is separated at the end part of the second separation substrate 20T. Furthermore, because the first bonding material 810 and second bonding material 820 are formed from different materials, it is easier for the first bonding material 810 and second bonding material 820 to separate at their boundary than the first bonding material 810 to separate into two directly below the cutting position SL1. In this way, as a result of this separation, it is possible for the sealing layer 700 to be easily peeled from the terminal 15 using the second bonding material 820.

Furthermore, although the first bonding material 810 and second bonding material 820 are separated only at their boundary in the example shown in FIG. 8, sections where they are separated other than their boundary may also be included. For example, a part of the first bonding material 810 may be attached to the second bonding material 820 side.

When the first bonding material 810 and second bonding material 820 are separated at their boundary section and the OLED layer 500 is separated from other layers by the low adhesion of the OLED layer 500, the sealing layer 700 becomes separated at the vicinity of the boundary section.

As a result, the end part 810e of the first bonding material 810 and the end part 700e of the sealing layer 700 appear on the terminal region TA side. Although the cutting position SL1 is set at a position at which the first bonding material 810 exists, the first bonding material 810e protrudes further to the terminal region TA side than the end part 20e of the second support substrate 20.

As explained above, in the present embodiment, not only is the first bonding material 810 used when bonding the first substrate 1Y and second substrate 2Y, the second bonding material 820 with strong adhesion is arranged to cover the terminal 15. In this way, it becomes easier to remove the sealing layer 700 and insulation material formed above the terminal 15 when removing the second separation substrate 20T positioned in the terminal region TA and it is possible to expose the conductive surface of the terminal 15.

In addition, generally the first bonding material 810 is formed to exist in the terminal region TA so as to expose the terminal 15. As a result, when the first substrate 1Y and second substrate 2Y are bonded, it is necessary to form a structure on which a space is formed between the substrates in the terminal region TA so that the first bonding material 810 before curing does not permeate (what is called a dam material or seal material etc.). On the other hand, in the present embodiment, because the second bonding material 820 is arranged in advance above the terminal region TA and removed along with the second separation substrate 20T, it is not necessary to use a dam material structure or the like.

Second Embodiment

In the second embodiment, an example is explained in the case where the translucent electrode 600 in the first embodiment is formed above the OLED layer 500 covering the terminal 15 before the first substrate 1Y and second substrate 2Y are bonded.

Figure 9:
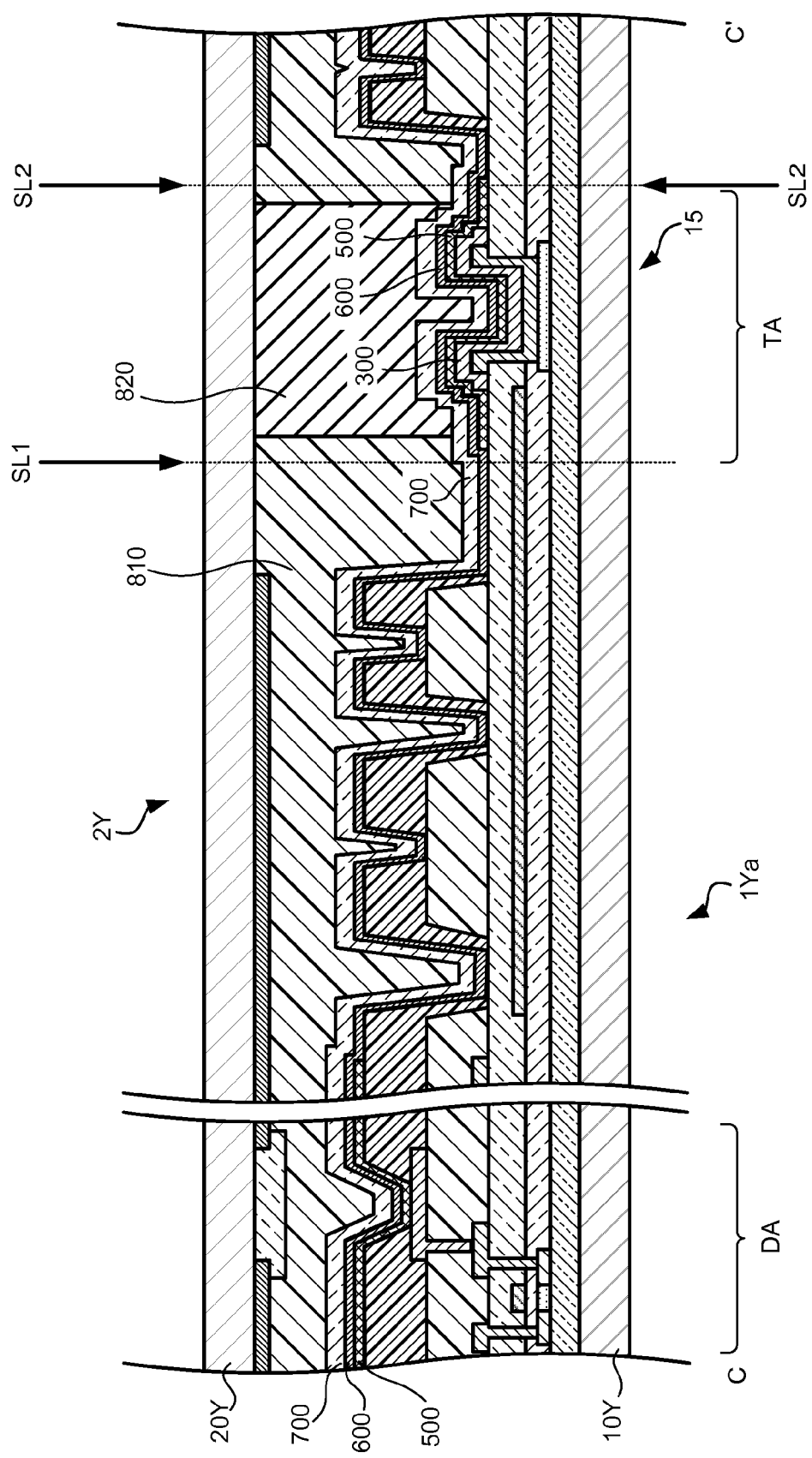
FIG. 9 is a schematic diagram showing a cross-sectional structure (corresponding to FIG. 5) of the bonding substrate in a second embodiment of the present invention.
Figure 10:
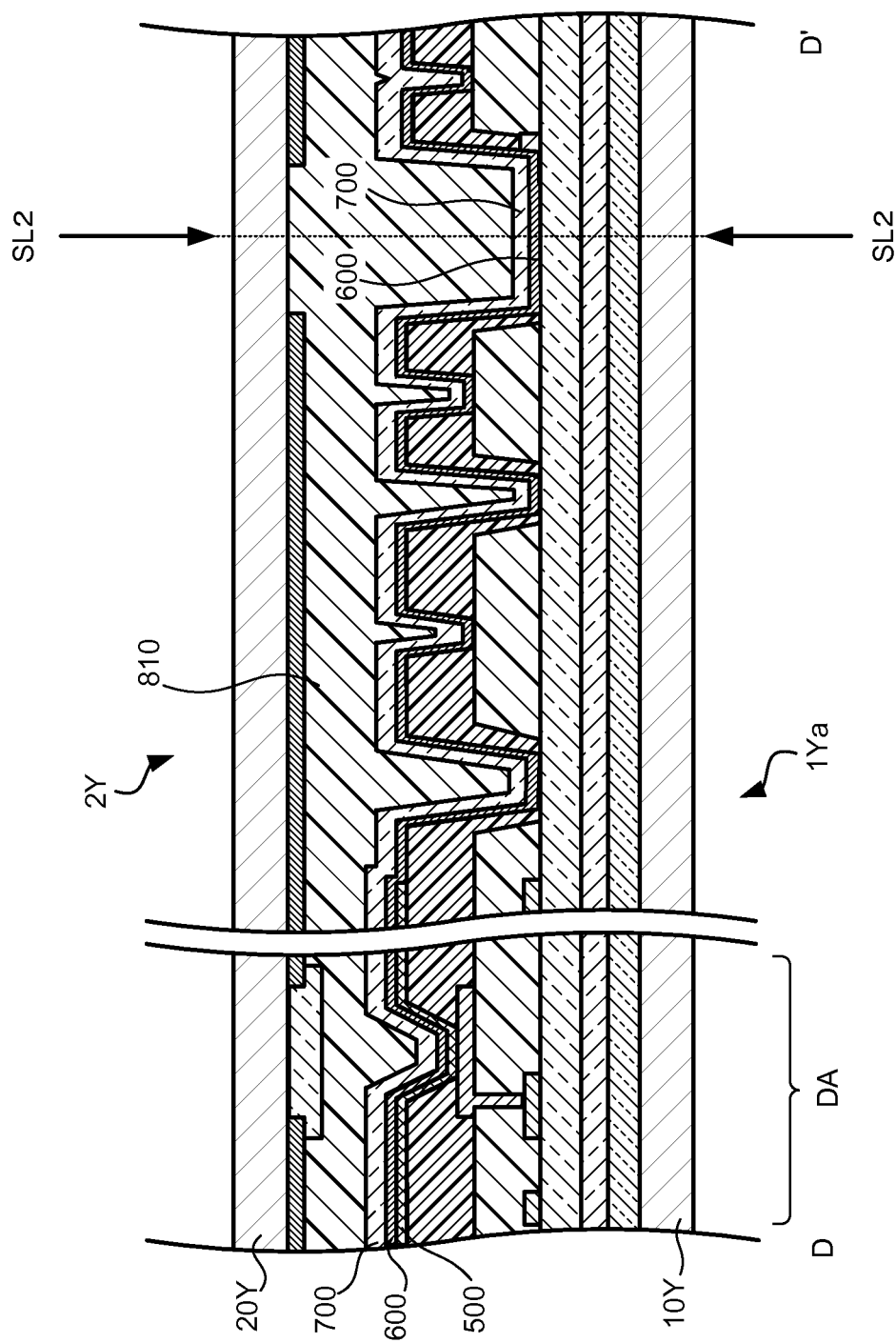
FIG. 10 is a schematic diagram showing a cross-sectional structure (corresponding to FIG. 7) of the bonding substrate in a second embodiment of the present invention.

FIG. 9 is a schematic diagram showing a cross-sectional structure of the bonding substrate in a second embodiment of the present invention. FIG. 10 is a schematic diagram showing a cross-sectional structure of the bonding substrate in a second embodiment of the present invention. FIG. 9 corresponds to FIG. 5 in the first embodiment (cross-sectional structure along the cross-sectional line C-C' in FIG. 6). FIG. 10 corresponds to FIG. 7 in the first embodiment (cross-sectional structure along the cross-sectional line D-D' in FIG. 6).

As is shown in FIG. 9 and FIG. 10, a first substrate 1Ya is formed with translucent electrode 60 across the entire surface of the substrate. That is, although vapor deposition was performed using as mask since the translucent electrode 600 was formed only in a necessary region in the first embodiment, in the second embodiment, a mask is not necessary since the translucent electrode 600 is formed on the entire surface of the substrate.

Figure 11:
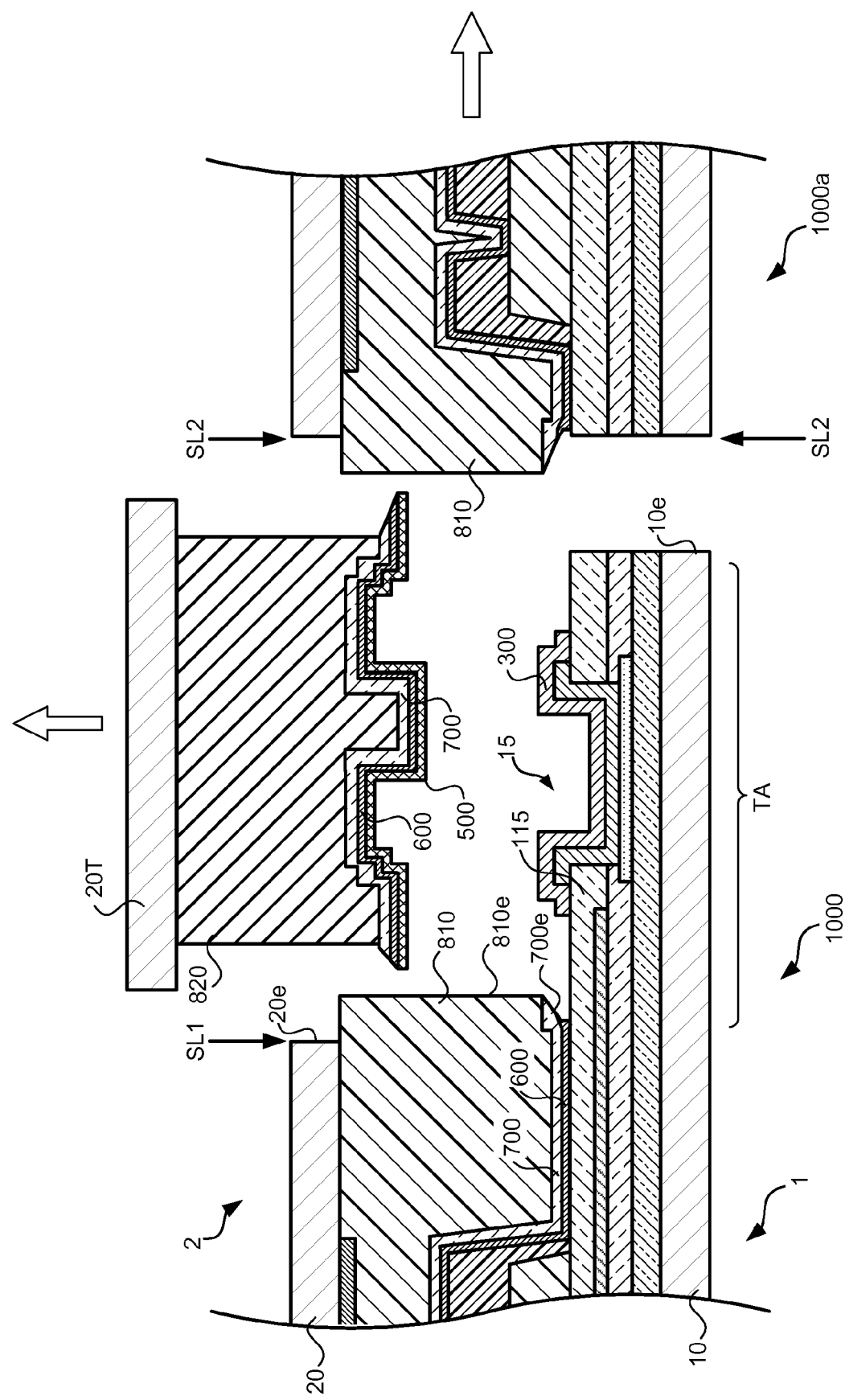
FIG. 11 is a diagram for explaining a method for separating a display device in the second embodiment of the present invention.

FIG. 11 is a diagram for explaining a method for separating a display device in the second embodiment of the present invention. As is shown in FIG. 11, even when the translucent electrode 600 is formed between the sealing layer 700 and OLED layer 500 above the terminal 15, the translucent electrode 600 is positioned further away from the terminal 15 than the OLED layer 500. As a result, the same as the explanation in FIG. 8, the translucent electrode 600 above the terminal 15 is removed together with the sealing layer 700 when the second separation substrate 20T is removed.

In the category of the concept of the present invention, a person ordinarily skilled in the art could conceive of various modifications and correction examples and could understand that these modifications and correction examples belong to the scope of the present invention. For example, with respect to each embodiment described above, a person ordinarily skilled in the art could appropriately perform an addition or removal of structural components or design modification or an addition of processes or an omission or change in conditions which are included in the scope of the present invention as long as they do not depart from the subject matter of the present invention.

What is claimed is:

1. A method of manufacturing a display device comprising:
    bonding together a first substrate and a second substrate sandwiching a first bonding material and a second bonding material, a substrate being formed by bonding the first substrate and the second substrate and including a plurality of the display devices, the first substrate being arranged with a display region and a terminal region corresponding to each of the display devices, the display region including a light emitting element including an organic layer, a sealing layer covering the light emitting element, and a drive element for making the light emitting element emit light, the terminal region being arranged with a terminal for supplying a signal to the drive element, the organic layer and the sealing layer being arranged above the terminal of the terminal region, the first bonding material being arranged in at least the display region, the second bonding material being a part of the terminal region and being arranged so as to cover the terminal, and the second bonding material having a stronger adhesion per unit area with respect to the second substrate than the first bonding material;
    cutting the second substrate at a cutting position between the terminal region and the display region for each of the display devices;
    removing the second substrate of the terminal region from the display device, at least one part of the terminal being exposed by removing the organic layer arranged above the terminal and the sealing layer together with the second substrate via the second bonding material adhered to the second substrate; and
    separating each of the display devices from the plurality of display devices.

2. The method of manufacturing a display device according to claim 1, wherein the light emitting element in the display region is sandwiched between a first electrode formed in each pixel and a second electrode formed in common across a plurality of pixels, and the second electrode is arranged between the light emitting element and sealing layer above the terminal when the second substrate is bonded to the first substrate.

3. The method of manufacturing a display device according to claim 1, the method further comprising:
    cleaning the terminal region after separating each of the display devices.

4. The method of manufacturing a display device according to claim 1, wherein the first bonding material is arranged between the first substrate and second substrate at a boundary part of adjacent display devices when the second substrate is bonded to the first substrate.

5. The method of manufacturing a display device according to claim 1, wherein the second bonding material before curing has a higher viscosity than the first bonding material before curing.

6. The method of manufacturing a display device according to claim 1, wherein when the second substrate of the terminal region is removed from the display device, the first bonding material between the second substrate and the first substrate protrudes further than an end part of the side of the terminal region of the second substrate.

7. A method of manufacturing exposing a terminal of a display device comprising:
    bonding together a first substrate and a second substrate sandwiching a first bonding material and a second bonding material, a substrate being formed by bonding the first substrate and the second substrate and including a plurality of the display devices, the first substrate being arranged with a display region and a terminal region corresponding to each of the display devices, the display region including a light emitting element including an organic layer, a sealing layer covering the light emitting element, and a drive element for making the light emitting element emit light, the terminal region being arranged with a terminal for supplying a signal to the drive element, the organic layer and the sealing layer being arranged above the terminal of the terminal region, the first bonding material being arranged in at least the display region, the second bonding material being a part of the terminal region and being arranged so as to cover the terminal, and the second bonding material having a stronger adhesion per unit area with respect to the second substrate than the first bonding material;
    cutting the second substrate at a cutting position between the terminal region and the display region for each of the display devices; and
    separating each of the display devices from the plurality of display devices, the second substrate of the terminal region being removed from the display device, and at least one part of the terminal being exposed by removing the organic layer arranged above the terminal and the sealing layer together with the second substrate via the second bonding material adhered to the second substrate.

8. The method of manufacturing exposing a terminal of a display device according to claim 7, wherein the light emitting element in the display region is sandwiched between a first electrode formed in each pixel and a second electrode formed in common across a plurality of pixels, and the second electrode is arranged between the light emitting element and sealing layer above the terminal when the second substrate is bonded to the first substrate.

9. The method of manufacturing exposing a terminal of a display device according to claim 7, the method further comprising:
    cleaning the terminal region after separating each of the display devices.

10. The method of manufacturing exposing a terminal of a display device according to claim 7, wherein the first bonding material is arranged between the first substrate and second substrate at a boundary part of adjacent display devices when the second substrate is bonded to the first substrate.

11. The method of manufacturing exposing a terminal of a display device according to claim 7, wherein the second bonding material before curing has a higher viscosity than the first bonding material before curing.

12. The method of manufacturing exposing a terminal of a display device according to claim 7, wherein when the second substrate of the terminal region is removed from the display device, the first bonding material between the second substrate and the first substrate protrudes further than an end part of the side of the terminal region of the second substrate.

\* \* \* \* \*